United States Patent [19]

Bowers et al.

[11] Patent Number: 5,077,494
[45] Date of Patent: Dec. 31, 1991

[54] WIDE TEMPERATURE RANGE MESFET LOGIC CIRCUIT

[75] Inventors: Derek F. Bowers; Douglas S. Smith, both of Sunnyvale, Calif.

[73] Assignee: Analog Devices, Inc., Norwood, Mass.

[21] Appl. No.: 396,536

[22] Filed: Aug. 21, 1989

[51] Int. Cl.⁵ ............................................ H03K 17/30
[52] U.S. Cl. .................................... 307/448; 307/443; 307/450; 307/455
[58] Field of Search ............... 307/443, 446, 448, 450, 307/455

[56] References Cited

U.S. PATENT DOCUMENTS

| | | | |
|---|---|---|---|
| 4,491,747 | 1/1985 | Shimizu | 307/443 |
| 4,698,544 | 7/1986 | Plagens | 307/446 |
| 4,703,204 | 10/1987 | Pham | 307/450 |
| 4,743,782 | 5/1988 | Nelson et al. | 307/448 |
| 4,746,817 | 5/1988 | Banker et al. | 307/443 |
| 4,810,905 | 3/1989 | Graham et al. | 307/446 |
| 4,885,480 | 12/1989 | Faris et al. | 307/443 |
| 4,912,745 | 3/1990 | Fitzpatrick | 307/443 |
| 4,931,699 | 6/1990 | Higashisaka | 307/450 |
| 4,937,474 | 6/1990 | Sitch | 307/450 |
| 4,945,258 | 7/1990 | Picard et al. | 307/443 |

FOREIGN PATENT DOCUMENTS 0020421 1/1987 Japan .................................. 307/455

OTHER PUBLICATIONS

IEEE Journal of Solid-State Circuits, 8-78, vol. SC-13, No. 4.

IEEE Journal of Solid-State Circuit, 8-88, vol. 23, No. 4.

Primary Examiner—Stanley D. Miller
Assistant Examiner—Terry D. Cunningham
Attorney, Agent, or Firm—Koppel & Jacobs

[57] ABSTRACT

A first Schottky diode is connected between the source of a first enhancement JFET and a low voltage line. The drain of the first enhancement JFET is connected through a first active load current source to a high voltage line, and also through a second Schottky diode and a second active load current source to the low voltage line. The first Schottky diode produces a voltage drop which maintains the source of the first enhancement JFET positive with respect to the low voltage line. The second Schottky diode produces a voltage drop complementary to that of the first Schottky diode, which causes the circuit to produce an output voltage across the second current source having a logically low level close to that of the low voltage line. This low output voltage positively turns off a first enhancement JFET of a next stage even at elevated temperatures where the voltage threshold is close to zero, since the source of the first enhancement JFET is held positive at one diode drop above the low voltage line by the first Schottky diode. A second enhancement JFET may be connected to supply current which maintains the first Schottky diode conductive at all times, and also to provide positive feedback to the first enhancement JFET by source coupling through the resistance of the first Schottky diode which enhances switching.

20 Claims, 2 Drawing Sheets

WIDE TEMPERATURE RANGE MESFET LOGIC CIRCUIT

BACKGROUND OF THE INVENTION

1. Field of the Invention

This invention relates to electronic logic circuitry, and more particularly to logic circuitry capable of being implemented in gallium arsenide.

2. Description of the Related Art

Logic circuits have been implemented using both bipolar and junction field effect transistor (JFET) technology. One significant limitation of bipolar circuit configurations is that at present they cannot be successfully implemented in gallium arsenide (GaAs), which is a high speed medium. Most JFETs similarly cannot be implemented in GaAs. However, GaAs is a suitable medium for one type of JFET, referred to as a MESFET (metal semiconductor field effect transistor). Unlike most JFETs in which the gate contact is established by a bipolar p-n junction, with MESFETs the gate junction is formed by a Schottky diode metal-semiconductor junction. In addition to compatibility with GaAs, MESFETs are much smaller than other JFETs and make possible circuitry that occupies significantly less chip area.

In the MESFET area, direct coupled FET logic (DCFL) circuits have been proposed which are particularly useful in applying high speed GaAs to very large scale integrated (VLSI) circuitry, but are also applicable to other semiconductor materials such as silicon. In these circuits, the output of one logic stage is normally used as the input to another logic stage. Since the input element of any given stage is normally an enhancement-type MESFET, for which the gate-source voltage drop is limited to about 0.7 volts, there is an upper voltage limit of about 0.7 volts for the high output of any particular logic stage which is connected as an input to another stage. This relatively low voltage swing makes the output susceptible to noise problems.

A number of known circuits are described in an article by Long et al., "Noise-Margin Limitations on Gallium-Arsenide VLSI", *IEEE Journal of Solid-State Circuits*, Vol. 23, No. 4, August 1988, pages 893–900. One such circuit, a NOR gate, is shown in FIG. 1. In this circuit enhancement MESFETs T1, T2 and T3 are used for switch transistors, and a depletion MESFET T4 serves as an active load current source. The depletion MESFET T4 has its gate and source connected together, so that it is always conducting. Its drain is connected to a positive voltage line V* so that the device functions as a current source. A 3-input NOR gate is illustrated, with inputs A, B and C applied to the gates of enhancement switching MESFETs T1, T2 and T3, respectively. The sources of the three switching transistors are connected to ground. The output is taken from the drains of the switching transistors and applied to the next stage. The switching transistors T1–T3 may be either conducting or non-conducting, depending upon the input signals A, B and C applied to their gates.

When the input to one of the enhancement-type switching MESFETs is high, electrons collect in its channel and it becomes conductive. Its channel resistance is then lower than that of depletion-type MESFET T4, holding the output voltage closer to ground than to V*. When the circuit input is low, on the other hand, the switching MESFET is non-conductive and the conducting channel of T4 holds the output voltage at a much higher level.

Since the circuit output is connected as an input to the gate of a MESFET in the next stage, the output voltage for the first stage is limited to about 0.7 volts. If it attempted to go to a higher voltage, the input MESFET for the next stage would behave like a diode. The low voltage output for this circuit, which is produced when high logic inputs are applied to each of the switching transistors T1–T3, is about 100 mV. Thus, the total output voltage swing between high and low states is about 0.6 volts. Furthermore, the circuit is inoperative at elevated temperatures on the order of 150° C., at which the voltage threshold of an enhancement MESFET drops to about zero.

Another prior logic circuit implemented with MESFETs in GaAs is shown in FIG. 2. This circuit is produced by Triquint Corporation under the designation ZFL, and employs depletion MESFETs. A current source MESFET T5 supplies current from the positive voltage reference V* to the drain of an input depletion MESFET T6 and the gate of another depletion MESFET T7. A capacitor C1 is connected across T5 to mitigate processing variations in the current source, while T7 is connected in series with another depletion MESFET T8 between the high and low voltage references V* and V— (V— can be ground). A diode D1 at the source of T6 provides a gate signal for T8, while the output is taken from the drain of T8 and source of T7.

While the circuit of FIG. 2 provides an inversion function, its operation is limited. As with the circuit of FIG. 1, its output voltage swing is limited to about 0.6 volts. Furthermore, its performance is heavily temperature dependent. There is also a problem in turning T8 fully on when the output should be low, because of a leakage current through D1.

Output voltage swings greater than 0.6 volts have been obtained with other MESFET circuits, but such circuits require more than the two voltage reference levels used in the circuits described above. Examples of such circuits are shown in FIG. 2 of the Long et al. article mentioned above (three reference voltage levels), and in FIG. 2 of a paper by Eden, "Capacitor Diode FET Logic (CDFL) Circuit Approach for GaAs D-MESFET ICs", *IEEE Gallium Arsenide Integrated Circuit Symposium*, October 1984 (five reference voltages). The use of more than two reference voltage levels increases both the complexity and cost of the overall circuit.

The problem caused by the low voltage MESFET threshold at elevated temperatures is compounded by technical factors encountered in the design and implementation of reliable circuits for practical applications. For example, in high integration microcircuit design, the package thermal resistance can easily raise die temperatures by 25° C., with the result that a logic circuit designed to operate at 125° C. will become inoperative at an actual operating temperature of 150° C. The consequence of increased temperature on the prior art logic circuits described with reference to FIGS. 1 and 2 is that switching becomes unreliable and ultimately inoperative as the temperature approaches 150° C., and the voltage thresholds of the enhancement MESFETs decrease to very low levels.

Enhancement MESFETs are typically made with a threshold voltage of between 100 mV and 200 mV. This is fixed, because to turn the device on, it is required to have the gate to source voltage at three or more times the threshold voltage. At the same time, to turn the device off, the gate must be at significantly less than the threshold voltage. Over temperature, the threshold voltage changes. The threshold voltage drops by about 1 mV for every degree Centigrade increase in temperature.

Starting with a threshold voltage of 100 mV at 25° C., the threshold will drop to zero if the temperature is increased to 125° C. The gate to source voltage then has to be negative to turn the device off. This effect has prevented known logic circuits using MESFETs from being successfully implemented in configurations having only two voltage levels.

SUMMARY OF THE INVENTION

In view of the above problems, the objects of the present invention are to provide a new type of logic circuitry that can be implemented with MESFETs on GaAs, which uses only two voltage reference levels, has a higher output voltage swing and correspondingly greater noise immunity than prior two-reference MESFET circuits, and is capable of operating at high temperatures on the order of 150° C.

These objects are realized with a JFET logic circuit that can be implemented in GaAs with MESFETs, and requires only two reference voltage levels to achieve an output swing of about 1.3–1.4 volts.

In accordance with the present invention, a first Schottky diode is connected between the source of a first enhancement JFET and a low voltage line. The drain of the first enhancement JFET is connected through a first active load current source to a high voltage line, and also through a second Schottky diode and a second active load current source to the low voltage line. The first Schottky diode produces a voltage drop which maintains the source of the first enhancement JFET positive with respect to the low voltage line. The second Schottky diode produces a voltage drop complementary to that of the first Schottky diode, which causes the circuit to produce an output voltage across the second current source having a logically low level close to that of the low voltage line. This low output voltage positively turns off a first enhancement JFET of a next stage even at elevated temperatures, where the voltage threshold is close to zero, since the source of the first enhancement JFET is held positive at one diode drop above the low voltage line by the first Schottky diode. A second enhancement JFET may be connected to supply current which maintains the first Schottky diode conductive at all times, and also to provide positive feedback to the first enhancement JFET by source coupling through the resistance of the first Schottky diode which enhances switching. The first current source is selected to provide more than twice the current of the second current source, to ensure positive turn-on of the next stage.

Additional features and advantages of the invention will be apparent to those skilled in the art from the following detailed description of the invention, taken together with the accompanying drawings, in which:

DETAILED DESCRIPTION OF THE INVENTION

Figure 3:
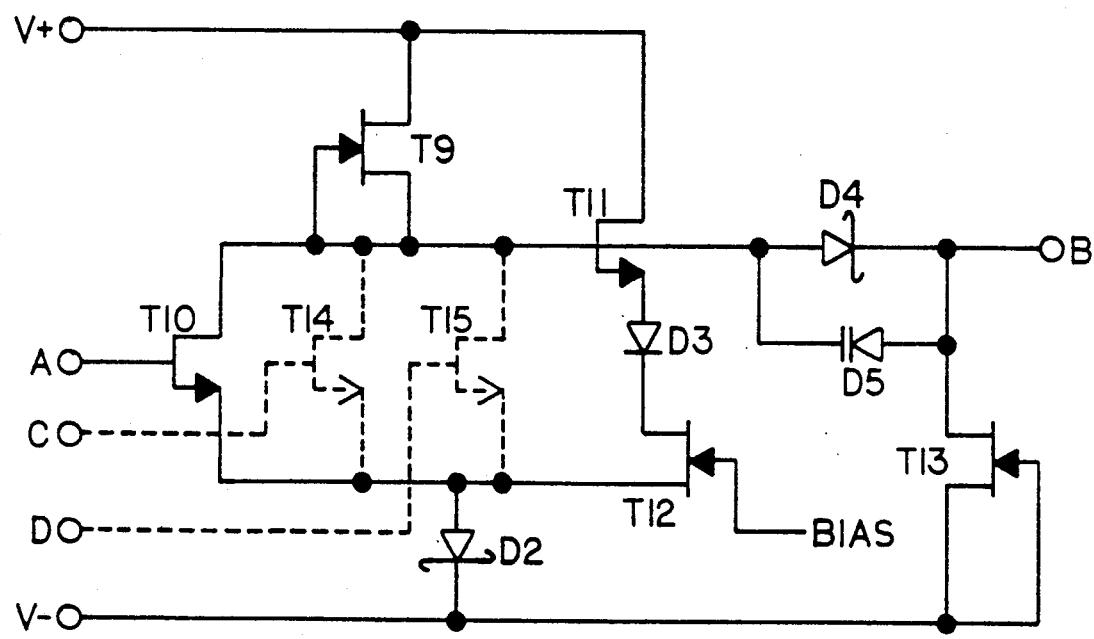
FIG. 3 is a schematic diagram of a logic gate circuit embodying the invention.

Referring now to FIG. 3, a wide temperature range logic gate circuit embodying the present invention is generally designated as 10. It is a basic inverter, which can either be employed by itself or modified to provide a more complex logic function. It employs only two voltage references, a low voltage reference V− on a line 12, and a high voltage reference V* on a line 14. V− can be ground potential, with V* typically about 3–10 volts above V−.

The circuit is preferably implemented with a GaAs process, using MESFETs. The invention is not limited to GaAs, however, and any other III-V semiconductor process capable of producing both enhancement and depletion MESFETs may be employed. While the invention is also applicable to JFETs in general, the particular advantages of MESFETs, such as small size and compatibility with GaAs, would be lost if another type of JFET were used. However, although the invention will be described in terms of specific embodiments employing MESFETs, the inventive concepts can be expanded to JFETs in general.

The present circuit includes a depletion MESFET T9 provided in a diode-connected configuration, with its drain connected to the high voltage line 14. The source and gate of the MESFET T9 are connected together, and are further connected to the drain of a first enhancement MESFET T10. The MESFET T9 in its illustrated form constitutes a constant current or active load current source.

The gate of the MESFET T10 is arranged to receive an input signal A, which may be from a prior logic stage or other device. The input signal A will typically range from a value close to the potential of the low voltage line 12 for a logically low input, to on the order of 1.3 to 1.5 V (approximately two diode drops) for a logically high input. The source of the MESFET T10 is connected to the anode of a Schottky diode D2, the cathode of which is connected to the low voltage line 12.

The drain of the first enhancement MESFET T10 is connected to the gate of a second enhancement MESFET T11. The drain of the MESFET T11 is connected to the high voltage line 14, whereas the source of the MESFET T11 is connected to the anode of a diode D3. The cathode of the diode D3 is connected to the drain of a current limiting, depletion MESFET T12, the source of which is connected to the anode of the diode D2. The gate of the MESFET T12 is connected to receive a bias voltage from an appropriate source (not shown).

The drain of the MESFET T10 and the gate of the MESFET T11 are further connected to the anode of a Schottky diode D4, the cathode of which is connected to the drain of a depletion MESFET T13. The output B of the circuit 10 is taken at the junction of the diode D4 and MESFET T13. The MESFET T13 is connected in a manner similar to the MESFET T9, more specifically in a diode configuration to function as an active load current source. This is accomplished by connecting the gate and source of the MESFET T13 to the low voltage line 12.

A diode D5 is connected in parallel with the diode D4, with the cathode of the diode D5 connected to the anode of the diode D4, and vice-versa. The diode D5 is of a conventional type, but is selected to have a relatively large value of capacitance.

The present wide temperature range logic design embodying the invention is intended to constitute a basis for high density, integrated circuits implemented in GaAs. These will include a substantial number of logic stages based on the circuit 10, with the output of one stage being connected to the input of the next stage.

In response to a logically high signal at the input A, the MESFET T10 is enhanced. This turns on the MESFET T10, causing current to flow through the channel between the drain and source thereof from the high voltage line 14, through the MESFET T9 and Schottky diode D2, to the low voltage line 12. The current flowing through the diode D2 produces a forward voltage drop thereacross of approximately 0.7 V. The voltage at the drain of the MESFET T10 is approximately this one diode drop plus a small drop on the order of 100 mV across the MESFET T10, or approximately 0.8 V.

Current from the source MESFET T9 also flows through the Schottky diode D4 and current source MESFET T13 to the low voltage line 12. The diode D4 produces a voltage drop which is approximately equal to the drop across the diode D2, or 0.7 V. The MESFET T13 produces a voltage drop of approximately 100 mV, similar to the MESFETs T9 and T10. The present logic circuit 10 thereby produces a logically low output voltage of approximately 100 mV (the drop across the MESFET T13) in response to a logically high input. The diode D4 is complementary to the diode D2, in that the voltage at the source of the MESFET T10 is raised by one diode drop by the diode D2, and the voltage at the output B is lowered by one diode drop by the diode D4. Under these conditions, the MESFET T13 sinks current from the MESFET T10 of the next stage.

In response to a logically low input A, the MESFET T10 is turned off. Current from the source MESFET T9 flows through the diode D4 and MESFET T13 to the low voltage line 12. The MESFET T9 also sources current to the MESFET T10 of the next stage through the output B, providing a logically high output.

The MESFET T9 is selected to supply more than twice the current of the MESFET T13, thus providing a surplus of current for turning on the MESFET T10 of the next stage. The logically high output voltage at B is clamped at approximately two diode drops (1.4 V) above the level of the low voltage line 12 by the MESFET T10 and diode D2 of the next stage.

The diode D2 is provided in accordance with the present invention to maintain the source of the MESFET T10 positive with respect to the low voltage line 12 at all times. As the temperature of the circuit 10 increases to the range of 150° C. and the voltage thresholds of the MESFETs approach zero, a negative gate to source voltage is necessary to positively turn the MESFETs off. With a previous stage producing a logically low output voltage which is slightly above that of the low voltage line (100 mV), and the source of the input MESFET T10 of the current stage held at one diode drop (0.7 V) above the low voltage line by the diode D2, the gate to source voltage of the MESFET T10 in response to a logically low input A is approximately −0.6 V, which is sufficient to turn off the MESFET T10 at any realistic operating temperature. The voltage drop across the diode D4 produces the low voltage output which positively turns off the MESFET T10 of the next stage.

As discussed above, the MESFET T10 is turned off by a low input voltage at A. Under these conditions, if the MESFET T11, diode D3, and MESFET T12 were not present, the current flow through the diode D2 would be limited to leakage current through the MESFET T10, which is insufficient to create a forward voltage drop across the diode D2. The voltage at the source of the MESFET T10 would be close to that of the low voltage line 12. Under high temperature conditions with the voltage threshold of the MESFET T10 approaching zero (in this case equal to the voltage of the line 12), an input voltage lower than that of the line 12 would be necessary to turn off the MESFET T10. This is not available in a two voltage level configuration.

The MESFET T11 is provided in accordance with the present invention to enable the MESFET T10 to be positively turned off at any realistic operating temperature without the necessity of a negative voltage source.

In response to a high input voltage at A, the MESFET T10 is turned on and passes sufficient current to forward bias the diode D2 and create the desired voltage drop thereacross. Under these conditions, the low drain voltage of the MESFET T10 turns off the MESFET T11, which does affect the diode D2.

However, in response to a logically low input signal at A, the MESFET T10 is turned off, and the gate of the MESFET T11 is pulled up to a high level by the MESFET T9. This enhances and thereby turns on the MESFET T11, which passes current therethrough from the high voltage line 14 through the diode D3, MESFET T12, and diode D2, to the low voltage line 12. The current flow through the diode D2 produces the desired voltage drop, ensuring that the voltage at the source of the MESFET T10 is raised to the level at which the MESFET T10 will be positively turned off by a low input signal.

The MESFET T11 functions as a current source which ensures that the diode D2 will pass enough current to be forward biased and produce a forward voltage drop at all times. Although the current source is illustrated as being in the form of an active device (MESFET T11), it may be replaced by a passive component such as a resistor (not shown) which passes current therethrough to the diode D2 at all times.

The diode D3 provides a function for the MESFET T11 similar to the function the diode D2 provides for the MESFET T10. More specifically, the diode D3 produces a voltage drop which raises the voltage at the source of the MESFET T11 above the voltage at the source of the MESFET T10, enabling the MESFET T11 to be positively turned off when the MESFET T10 is turned on and produces a low voltage at its drain.

The MESFET T12 functions to limit the current flow through the diode D2 which is adjusted to a predetermined value corresponding to a bias voltage applied to the gate of the MESFET T12. The bias voltage may be provided by a resistor voltage divider network (not shown) connected between the voltage lines 12 and 14, or by an external source.

The diode D5 is optional, and may be provided to capacitively couple strong transient signal edges to the output B. The diode D5 does not conduct static current, and may be replaced by a capacitor or other capacitive device within the scope of the invention.

In addition to providing current flow through the diode D2, the MESFET T11 functions to dynamically enhance the switching of the MESFET T10. A low input signal A turns off the MESFET T10, which produces a high drain voltage. This turns on the MESFET T11. Although minimal current flows through the diode D2 from the MESFET T10, the diode D2 is supplied with current from the high voltage line 14 through the MESFET T11. This current, flowing through the finite resistance inherent in the diode D2, creates a voltage drop which pulls up the source of the MESFET T10 and causes it to turn off faster than it would if the MESFET T11 were not present. The effect is source coupling between the MESFETs T10 and T11 through the resistance of the diode D2, and is mutual in that turning off the MESFET T10 faster causes the MESFET T11 to turn on faster.

The positive feedback works in the opposite direction with a high voltage applied to the input A. The MESFET T10 is turned on, and produces a low drain voltage. This turns off the MESFET T11, which shuts off the current supply therethrough to the diode D2. The voltage across the diode D2 and thereby the voltage at the source of the MESFET T10 drops, causing the MESFET T10 to turn on faster than if the MESFET T11 were not present. The effect is mutual, in that turning on the MESFET T10 faster causes the MESFET T11 to turn off faster.

The output of the circuit 10 is essentially a current, and the output high voltage level is limited by the forward conduction of the gate to source junction of the next logic stage as discussed above. This gives a logic high of 2 diode drops, or about 1.5 V at room temperature. The output low logic level is near the level of the low voltage line 12, since the voltage on the anode of the diode D4 is insufficient to forward bias the diode D4, and the MESFET T13 is sinking far more current than is leaking through the diode D4.

A typical low logic level output voltage would be 100 mV above the level of the low voltage line 12. The total logic swing is thus 2 diode drops $-100$ mV $= 1.4$ V at room temperature. This relatively large voltage range, together with hysteresis inherent in the device, gives the circuit a large noise margin of about 0.9 V at room temperature, and in excess of 0.5 V at 150° C. The low temperature operation of the circuit is not affected by the enhanced high temperature operation thereof, enabling the present logic circuit to operate reliably over a very large temperature range compared to the prior art.

Figure 1:
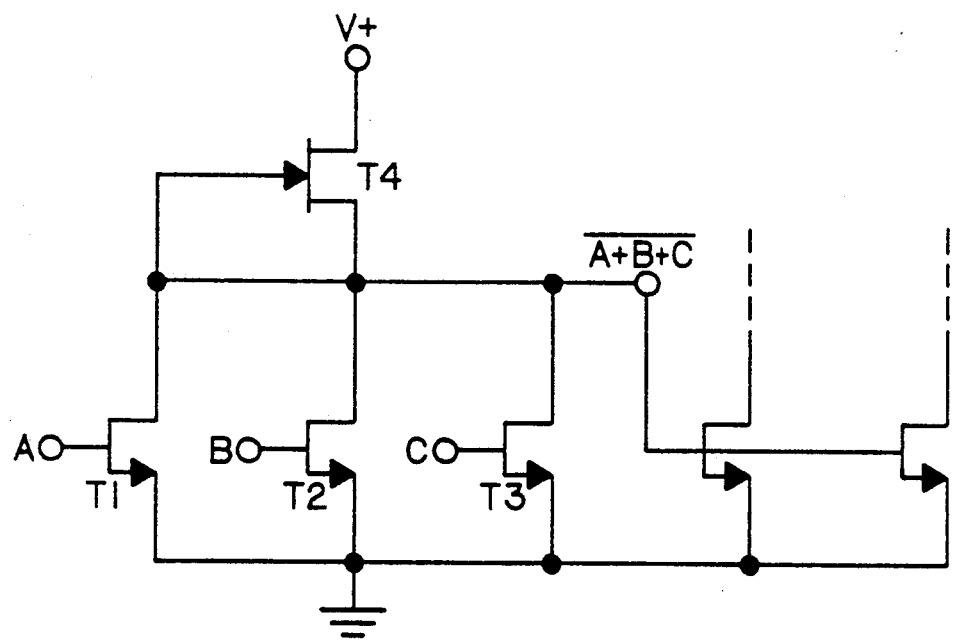
FIGS. 1 and 2 are schematic diagrams of two different prior art logic circuits, described above.
Figure 2:
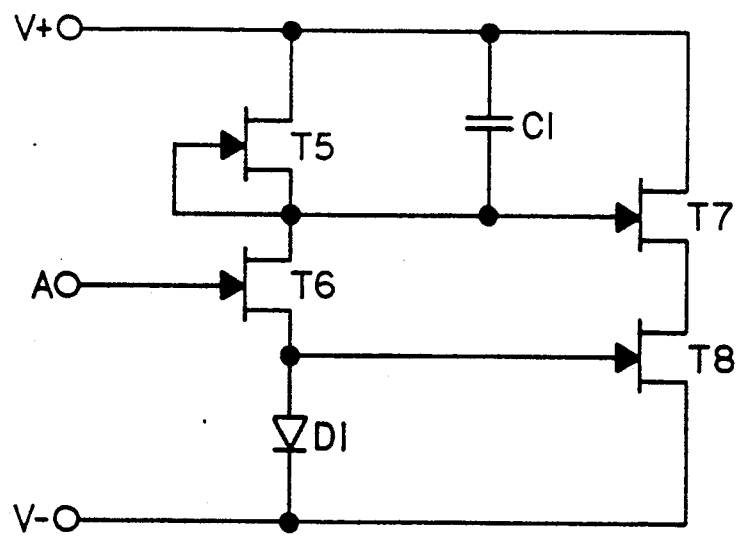

The inverter circuit 10 described thus far may be expanded to provide a variety of other logical functions. For example, as illustrated in broken line, enhancement MESFETs T14 and T15 may be connected in parallel across the drain to source circuit of the MESFET T10 to provide a logical NOR (NOT OR) configuration similar to the prior art circuit illustrated in FIG. 1. The output of the expanded circuit is the inverted value of the logical sum of the input signal A and input signals C and D applied to the gates of the MESFET T14 and T15.

It will be understood that the terms "source" and "drain" as applied to field effect transistors merely define opposite ends of a channel region which is controlled by a voltage applied to a gate. The source and drain are interchangeable in that current may flow into either one and out of the other. Therefore, the terms "source" and "drain", and the relative polarities of voltages applied thereto, as used in the present specification and claims, are arbitrary and reversible within the scope of the invention, and are not to be considered as limiting the invention to one or the other of the possible configurations of polarities.

The present logic circuit provides a significant increase in the input and output voltage swings achievable with only two reference voltage lines, and a corresponding increase in noise immunity. It is capable of good quality logic switching at temperatures of 150° C. and over, and can be implemented with MESFETs in GaAs. While numerous variations and alternate embodiments will occur to those skilled in the art, it is intended that the invention be limited only by the appended claims.

We claim:

1. A junction field effect transistor (JFET) logic circuit, comprising:
   high and low voltage lines;
   a first enhancement JFET having a gate for receiving an input signal, a source, and a drain;
   first current source means connected in circuit between the drain of said first enhancement JFET and the high voltage line;
   first voltage dropping means connected in circuit between the source of said first enhancement JFET and the low voltage line;
   second current source means connected in circuit between the drain of said first enhancement JFET and the low voltage line;
   second voltage dropping means connected in circuit between the drain of said first enhancement JFET and the second current source means, whereby an output signal is produced at the junction of the second current source means and the second voltage dropping means; and
   a second enhancement JFET having a gate connected in circuit to the drain of said first enhancement JFET, a drain connected in circuit to the high voltage line, and a source connected in circuit to the source of said first enhancement JFET, the first voltage dropping means having a value of electrical resistance selected to provide source coupling and thereby positive feedback between said first and second enhancement JFETs.

2. A logic circuit as in claim 1 in which the first and second voltage dropping means produce approximately equal voltage drops.

3. A logic circuit as in claim 1, in which:
   the first voltage dropping means comprises a first diode having an anode connected in circuit to the source of said first enhancement JFET and a cathode connected in circuit to the low voltage line; and
   the second voltage dropping means comprises a second diode having an anode connected in circuit to the drain of said first enhancement JFET and a cathode connected in circuit to the second current source means.

4. A logic circuit as in claim 3, in which the first and second diodes are Schottky diodes.

5. A logic circuit as in claim 1, further comprising third voltage dropping means connected in circuit between the sources of said second and first enhancement JFETs.

6. A logic circuit as in claim 5, in which the third voltage dropping means comprises a diode.

7. A logic circuit as in claim 1, further comprising current limiting means connected in circuit between the sources of said second and first enhancement JFETs.

8. A logic circuit as in claim 7, in which the current limiting means comprises a depletion JFET having a gate for receiving a bias voltage, a drain connected in circuit to the source of the second enhancement JFET, and a source connected in circuit to the source of said first enhancement JFET.

9. A logic circuit as in claim 1, in which the first and second enhancement JFETs are MESFETs, and are implemented in gallium arsenide.

10. A logic circuit as in claim 1, in which the first and second current source means each comprise a diode-connected, depletion JFET.

11. A logic circuit as in claim 1, further comprising a third enhancement JFET having a gate for receiving a second input signal, a drain connected to the drain of said first enhancement JFET, and a source connected to the source of said first enhancement JFET.

12. A logic circuit as in claim 1, further comprising capacitance coupling means connected across the second voltage dropping means.

13. A logic circuit as in claim 1, in which the first current source means supplies more than twice as much current as the second current source means.

14. A junction field effect transistor (JFET) logic circuit, comprising:
   high and low voltage lines;
   a first enhancement JFET having a gate for receiving an input signal, a source, and a drain;
   first current source means connected in circuit between the drain of said first enhancement JFET and the high voltage line;
   first voltage dropping means connected in circuit between the source of said first enhancement JFET and the low voltage line;
   second current source means connected in circuit between the drain of said first enhancement JFET and the low voltage line;
   second voltage dropping means connected in circuit between the drain of said first enhancement JFET and the second current source means, whereby an output signal is produced at the junction of the second current source means and the second voltage dropping means; and
   a capacitance coupling means connected across the second voltage dropping means, said capacitance coupling means comprising a diode having a cathode connected in circuit to the drain of said first enhancement JFET, and an anode connected in circuit to the second current source means.

15. A junction field effect transistor (JFET) logic circuit, comprising:
   high and low voltage lines;
   a first enhancement JFET having a gate for receiving an input signal, a source, and a drain;
   first current source means connected in circuit between the drain of said first enhancement JFET and the high voltage line;
   first voltage dropping means connected in circuit between the source of said first enhancement JFET and the low voltage line, said first voltage dropping means comprising a diode having an anode connected in circuit to the source of said first enhancement JFET and a cathode connected in circuit to the low voltage line,
   second current source means connected in circuit between the drain of said first enhancement JFET and the low voltage line;
   second voltage dropping means connected in circuit between the drain of said first enhancement JFET and the second current source means,
   whereby an output signal is produced at the junction of the second current source means and the second voltage dropping means and the third current source means for supplying sufficient current flow through the diode to maintain the diode forward biased at all times.

16. A logic circuit as in claim 15, in which the third current source means comprises a second enhancement JFET having a gate connected in circuit to the drain of said first enhancement JFET, a drain connected in circuit to the high voltage line, and a source connected in circuit to the source of said first enhancement JFET.

17. A logic circuit as in claim 16, further comprising third voltage dropping means connected in circuit between the sources of said second and first enhancement JFETs.

18. A logic circuit as in claim 17, in which the third voltage dropping means comprises a diode.

19. A logic circuit as in claim 16, further comprising current limiting means connected in circuit between the sources of said second and first enhancement JFETs.

20. A logic circuit as in claim 19, in which the current limiting means comprises a depletion JFET having a gate for receiving a bias voltage, a drain connected in circuit to the source of the second enhancement JFET, and a source connected in circuit to the source of said first enhancement JFET.

* * * * *